United States Patent [19]

Schwartz

[11] Patent Number: 5,568,356
[45] Date of Patent: Oct. 22, 1996

[54] STACKED MODULE ASSEMBLY INCLUDING ELECTRICALLY INTERCONNECTED SWITCHING MODULE AND PLURAL ELECTRONIC MODULES

[75] Inventor: David A. Schwartz, Moorpark, Calif.

[73] Assignee: Hughes Aircraft Company, Los Angeles, Calif.

[21] Appl. No.: 423,423

[22] Filed: Apr. 18, 1995

[51] Int. Cl.$^6$ .............................. H05K 7/00; H01H 9/00
[52] U.S. Cl. ..................... 361/679; 200/1 R; 361/729; 361/735
[58] Field of Search ............ 200/1 R, 4, 175–180; 361/679, 727, 728–735, 784, 790, 803

[56] References Cited

U.S. PATENT DOCUMENTS

| | | | |
|---|---|---|---|
| 3,054,024 | 9/1962 | Van Dillen et al. | 361/729 X |
| 3,299,403 | 1/1967 | Young | 361/735 X |
| 3,403,300 | 9/1968 | Horowitz et al. | 361/735 |
| 3,761,858 | 9/1973 | Oka | 361/729 X |
| 3,818,283 | 6/1974 | Ward | 361/727 X |
| 4,520,427 | 5/1985 | Brotherton et al. | 361/735 X |
| 4,734,825 | 3/1988 | Peterson | 361/729 X |
| 4,773,868 | 9/1988 | Heinecke | 361/683 X |
| 4,858,072 | 8/1989 | Chall, Jr. | 361/730 X |
| 4,866,219 | 9/1989 | Riding | 361/729 X |
| 5,241,455 | 8/1993 | Fukui et al. | 361/728 X |

*Primary Examiner*—J. R. Scott
*Attorney, Agent, or Firm*—V. D. Duraiswamy; W. K. Denson-Low

[57] ABSTRACT

A system of modules is provided in which each module has a set of n connectors which are spatially invariant as the module is rotated in steps of 360/n degrees about a module axis. The connectors are configured for axial engagement and a switching one of the modules includes a switch that can connect any one of its connectors with any other of its connectors. The modules are coaxially arranged with respective connectors of adjacent modules engaged. This arrangement is spatially compact and any one of the modules can be selectively connected to any other. In other embodiments, the modules have polygon-shaped perimeters and the connectors are configured for axial and radial engagement. These modules can be arranged both in vertical stacking and planar tiling relationships.

18 Claims, 8 Drawing Sheets

STACKED MODULE ASSEMBLY INCLUDING ELECTRICALLY INTERCONNECTED SWITCHING MODULE AND PLURAL ELECTRONIC MODULES

BACKGROUND OF THE INVENTION

1. Field of the Invention

The present invention relates generally to electronics packaging and interconnection systems.

2. Description of the Related Art

A variety of electronic interconnection systems have been proposed for embedded microprocessor applications, i.e., applications in which the microprocessors are preprogrammed for a specific task and buried within the equipment that they serve. An exemplary system includes a "fat tree" network topology which can connect a plurality of microprocessors through an arrangement of crossbar switches (crossbar or crosspoint switches are described in a variety of references, e.g., Katz, Randy H., *Contemporary Logic Design*, Benjamin-Cummings Publishing, Redwood City, 1994, pp. 226–228).

In a fat tree, a crossbar switch can be positioned at each of a plurality of network nodes. Each crossbar switch can connect any of its "parent" ports with any of its "children" ports. Each port is the entry to a channel that includes an n-bit datapath (data, control and clocking). The switches are arranged in a series of ordered levels so that a switch in any one of the levels has data paths to the parent ports of a number of switches (e.g., four) in the next lower level and data paths to the children ports of a number of switches (e.g., two) in the next higher level. The microprocessors are coupled to the children ports of the lowest level.

Therefore, a plurality of data paths are available between any selected pair of microprocessors. Messages can be sent along various ones of these data paths simultaneously. Message priorities can be established to address situations in which two messages are routed along the same path portion. In this case, the message with the lower priority relinquishes the path portion to the other message.

Interconnection systems of the fat tree type are intended to reduce operation times by providing an abundance of component interconnection paths so that multiple processor pair connections can be made simultaneously. As a consequence, these systems are generally bulky because of their high parts count, e.g., a large number of crossbar switches. However, many interconnection applications, e.g., missiles and space vehicles, require that spatial volume be a prime consideration.

SUMMARY OF THE INVENTION

The present invention seeks to support and selectively interconnect electronic circuits with a limited number of module configurations which can be combined to form various, spatially compact systems.

These systems are realized with modules that are each configured with one or more connectors that are positioned at a set of connector locations. The set is arranged in the same spatial relationship on each module and further arranged to be spatially invariant if each module is rotated about a module axis in steps of 360/n degrees where n is the number of connector locations. In one module embodiment, the connectors of one module are configured to be axially engageable with the connectors of an adjacent module.

A plurality of these modules are converted to electronics-support modules by the addition of a signal-interconnection bus to each module. One end of the bus is coupled to one of the module connectors and the other end is available for coupling to the electronics carried by the module. Another module is converted to a switching module by the addition of a switch network capable of connecting together any desired set of its connectors.

In one system embodiment, a plurality of electronics support modules and at least one switching module are coaxially aligned with the modules axially and rotationally positioned so that corresponding connectors on adjacent modules engage each other. With appropriate switch commands, the interconnection bus of each support module can be selectively accessed from a respective switch port through a respective path of vertically aligned and engaged connectors.

If the electronics-support modules are rotationally positioned so that no two busses are axially aligned, each of the switching module's connectors is connected to the electronics of a different support module. If one group of axially aligned connectors is reserved for an input/output path, a corresponding switch port can be used to couple the electronics of any desired support module with the input/output path.

In another module embodiment, each module has a polygon perimeter, and the connectors are configured for both radial and axial engagement. Each connector is preferably formed on a respective face of its module's polygon. In addition to an axial stacking relationship, these modules can be combined in a planar tiling relationship. Planar systems are formed by arranging the modules in a coplanar relationship, positioned to radially and rotationally engage the ports of adjacent modules.

In one planar system embodiment, the modules are mounted on an interconnection substrate. One or more switching modules can selectively connect the signal-interconnection bus of any pair of support modules or selectively connect any interconnection bus with an input/output connector. Other system embodiments can be formed by arranging modules in combinations of axial and planar relationships. In one module embodiment, the polygon perimeter is a hexagon. A planar arrangement of these modules fills an available planar space without the presence of spatial voids. In another module embodiment, the polygon is an octagon and arrangements of these modules form intermodule passages which can be used for associated purposes such as heat removal and power supply.

The novel features of the invention are set forth with particularity in the appended claims. The invention will be best understood from the following description when read in conjunction with the accompanying drawings.

DESCRIPTION OF THE PREFERRED EMBODIMENTS

Figure 1:
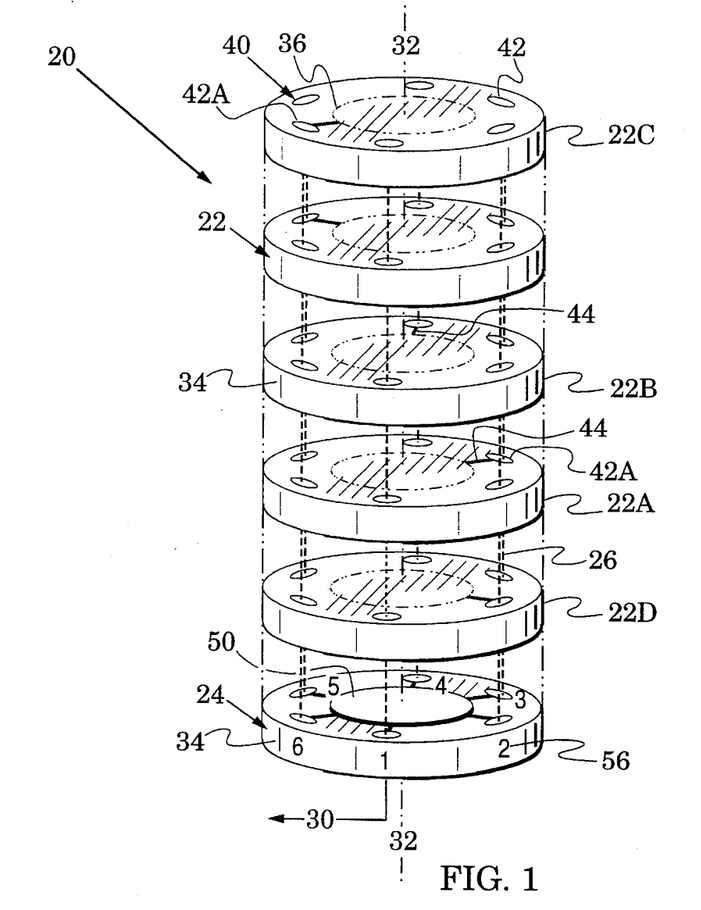
FIG. 1 is an exploded, perspective view of an electronics support and signal interconnection system in accordance with the present invention.
Figure 2A:
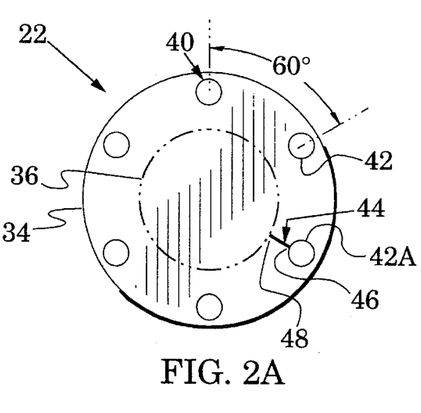
FIG. 2A is a plan view of an electronics support module in the system of FIG. 1.
Figure 2B:
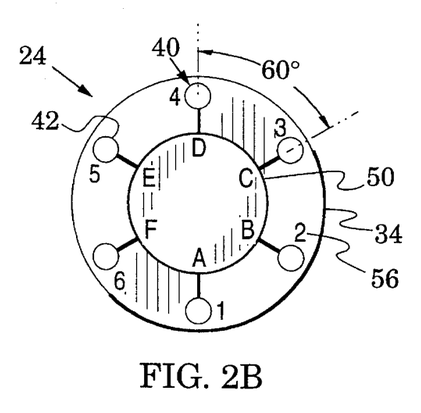
FIG. 2B, is a plan view of a switching module in the system of FIG. 1.

FIG. 1 illustrates an electronics support and signal interconnection system 20 in accordance with the present invention. The system 20 has a plurality of electronics support modules 22 and a switching module 24 which are arranged with a common axis. A support module 22 is shown in FIG. 2A and the switching module 24 is shown in FIG. 2B. The modules are configured to define a plurality of signal-interconnection paths between any selected pair of support modules 22, or between any support module 22 and an external system that can be accessed through an input/output path 30. The system 20 can be realized with only two module configurations, the support module 22 and the switching module 24. The system is particularly suited for support and interconnection of electronic circuits in a compact arrangement which is realized by vertical stacking of modules.

Each of the modules 22 and 24 have a generally planar configuration in which the module plane is substantially orthogonal to a module axis 32 (the axis 32 in FIG. 1 is both a module and a system axis). Each module extends along its plane to terminate in a perimeter 34. Although the perimeter 34 is circular in the embodiment 20, it can generally be formed in any selected shape. For example, other embodiments of the invention will be described hereinafter which have perimeters shaped to define a regular polygon. The polygon shape facilitates a planar tiling arrangement of modules in addition to the vertical stacking arrangement that is illustrated in FIG. 1.

The modules 22 are configured to carry electronic circuits, e.g., microprocessors, memory, analog-to-digital converters, digital-to-analog converters, and switches, in a centrally located module portion 36. The outline of the portion 36 is not important. Accordingly, it is shown only as a broken line in FIGS. 1, 2A and 2B.

Each of the modules 22 and 24 includes a set 40 of n signal-interconnection connectors 42 which are arranged in the same spatial relationship on each module. As indicated in the figures, n is six in the embodiment 20. The connectors 42 are also arranged on each module so that each set 40 is spatially invariant as its respective module is rotated in steps of 360/n degrees about the module's axis 32. In the specific case of the system 20, this rotational step is 360/6=60°. To form a spatially invariant set, the connectors 42 are spaced 60° apart as indicated in FIGS. 2A and 2B.

Each of the support modules 22 also includes a signal-interconnection bus 44 that provides an interconnection path between the module's electronics and a selected bus connector 42A. One end 46 of the bus 44 is connected to the bus connector 42A, and the other end 48 is available for coupling to electronic circuits that are carried in the module portion 36.

Figure 3:
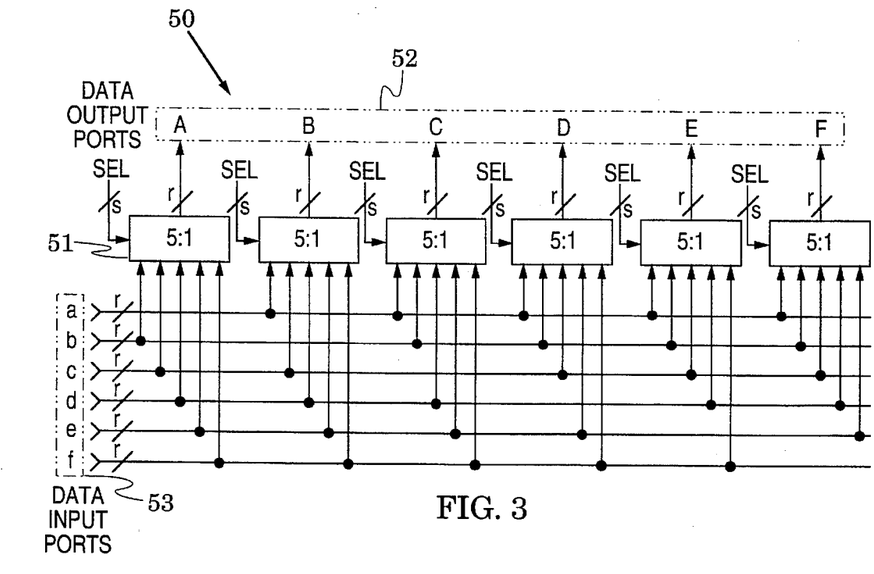
FIG. 3 is a schematic diagram of a switch network that is carried on the switching module of FIG. 2B.

The switching module 24 carries a crossbar switch 50 in its module portion 36. A schematic of the crossbar switch 50 is shown in FIG. 3. The switch has a plurality of 5:1 multiplexers 51 that have data output ports 52 which are labeled A–F and data input ports 53 which are labeled a–f. The output and input signal paths are r-bit parallel signal lines. Any individual multiplexer 51 can be selected by a 3-bit select (SEL) command. The switch 51 provides a data path between any selected pair of its switch ports.

Figure 4:
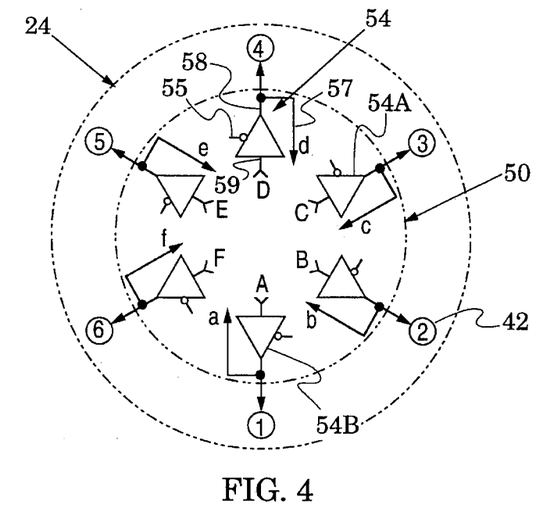
FIG. 4 is a block diagram illustrating a realization of the switch network of FIG. 3.

An exemplary realization of the schematic of FIG. 3 is illustrated in FIG. 4. To facilitate the description of the switch realization, the connectors 42 of the switching module 24 are numbered 1–6, and corresponding indicia 56 of the connector numbers and the switch port letters is shown in FIGS. I and 2B. Each of the 5:1 multiplexers 51 are realized with a tri-state buffer 54 which is connected through its output 58 to a different one of the connectors 42 of the switching module 24. Each of the buffers can be commanded by its select line 55 to be in a buffer or a high-impedance state. In the buffer state, the output 58 is respectively high and low when the input 59 is high and low. In the high-impedance state, the output 58 is disconnected from the input 59 and presents a high impedance. The output 58 of each buffer 54 is also connected through path 57 to other buffer inputs 59 in accordance with the schematic of FIG. 3.

In operation, the switch 50 can selectively send data from any of the connectors 42 to any other of the connectors. For example, if tri-state buffer 54A is placed in its buffer state and tri-state buffer 54B is placed in its high-impedance state, data can be transmitted from connector 1 to connector 3 of the module 24. Reversing these states allows data to be transmitted from connector 3 to connector 1.

The switch realization of FIG. 4 is particularly suited for the transmission of digital data. Other realizations of the switch 50 can be structured to facilitate the transmission of other signal types. For example, if microwave signals are of interest, the r-bit lines of FIG. 3 could be microstrip and they could be coupled by microstrip multiplexers.

FIG. 1 is an exploded view which indicates that the modules 22 and 24 are arranged along a common axis 32, with adjacent modules positioned to axially align the connectors of each of the modules with corresponding connectors on adjacent modules. In the final assembled configuration of the system, the modules 22 and 24 of FIG. 1 are axially moved into an adjoining relationship to engage the connectors 42 of adjacent modules. Exemplary connectors 42 which are suitable for axial engagement are described hereinbelow with reference to FIGS. 11A–11E.

In the system embodiment 20, the support modules 22 are rotationally positioned so that none of the bus connectors 42A are axially aligned. Although other rotational positions may be used, this arrangement allows the switch 50 to exclusively select the electronic circuits of each support module 22.

To illustrate the operation of the system 20, assume that the switch 50 is set to transmit data between its ports C and D. This provides a transmission path between the busses 44 of modules 22A and 22B. This connection is made through connectors number 3 and 4 of the switching module 24. The bus connectors 42A of the support modules 22A and 22B reach these connectors through the axially aligned connectors of intervening support modules. Thus, the electronics of support modules 22A and 22B are interconnected.

To illustrate another possible switch setting, assume that the switch 50 is set to connect its ports A and C. The interconnection bus 44 of support module 22A is now connected to the input/output path 30. The connection is made through connectors number 1 and 3 of the switching module 24 and the bus connector 42A of the module 22A, through the axially aligned connectors of intervening support modules. Similarly, the electronic circuits carried by any one of the support modules 22 can be selectively coupled to the electronic circuits of any other of the support modules 22, and the electronic circuits of any one of the support modules can be selectively coupled to the input/output path 30. The intermodule data paths are formed by the axially engaged connectors 42.

The system embodiment 20 is shown in FIG. 1 to have a set 40 of six connectors 42 on each of its support modules 22 and its switching module 24. Other system embodiments may omit one or more of the module connectors if they are not in a direct signal transmission path. For example, all of the connectors 42, with the exception of the bus connector 42A, of module 22C could be eliminated without breaking a signal transmission path. This follows because none of these connectors intervene between the switching module 24 and a bus connector 42A of another support module. In contrast, most of the connectors of module 22D intervene between the connectors of the switching module and corresponding bus connectors 42A on other support modules so that they cannot be omitted without breaking a signal transmission path.

More generally, therefore, each module need only carry one or more connectors that are each positioned at a different one of a set of n connector locations, wherein the set has the same spatial relationship on each of said modules and is spatially invariant as its respective module is rotated in steps of 360/n degrees about its axis. One or more of the connector locations may be left vacant if it is not needed to complete an intervening portion of a signal path.

Figure 5:
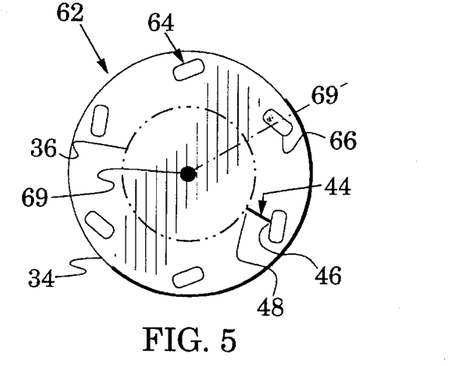
FIG. 5 is a plan view of another electronics support module.

FIG. 5 illustrates another support module embodiment 62. The module 62 is similar to the module 22 with like elements indicated by like reference numbers. In contrast to the module 22, the module 62 has a set 64 of connectors 66 that have an oblong shape and that are tilted relative to a radial line 68. As with the module 22, the set 64 of connectors 66 is spatially invariant as the module 62 is rotated in steps of 60 degrees about the module's axis 69. In general, any connector configuration may be used to practice the teachings of the invention as long as each connector of a set of n connectors is positioned by a rotation of 360/n degrees from an adjacent connector. With this positioning, the set of connectors will be spatially invariant when the module is rotated in steps of 360/n. In any of these rotational steps, the module connectors will be aligned for axial engagement. This arrangement facilitates the formation of a variety of system interconnections.

Another electronics support and signal interconnection system 70 is shown in FIGS. 6, 7A, 7B and 8. Although it contains a greater number of support modules, the system 70 is similar to the system 20, with like elements indicated by like reference numbers. However, the system 70 has eight electronics support modules 72 and two switching modules 74 which each have a perimeter 76 with n faces 78 that define a substantially regular polygon when the module is viewed axially. In particular, n=6 in the system 70 so that the perimeter faces 78 define a hexagon. A set 80 of connectors 82 is arranged similarly to the set 40 of the system 20, except the connectors 82 adjoin the perimeter 76. In particular, each connector 82 adjoins one of the perimeter faces 78. A selected bus connector 82A of each module is coupled to the electronics carrying portion 36 through a signal-connection bus 44.

Figure 6:
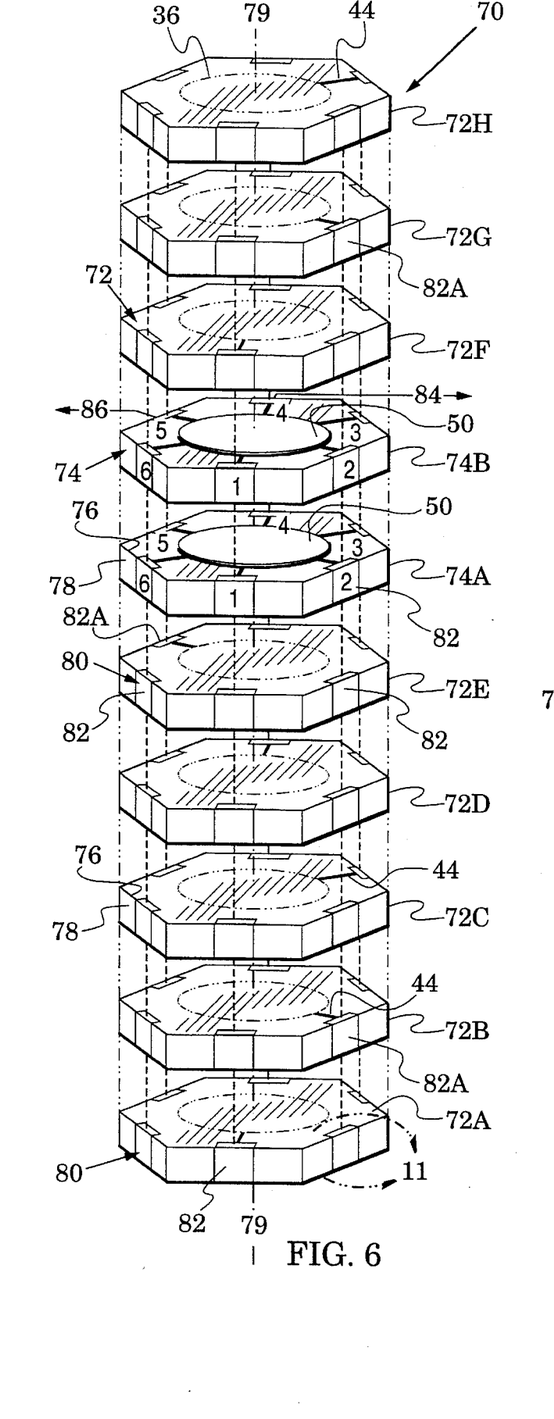
FIG. 6 is an exploded, perspective view of another electronics support and signal interconnection system.
Figure 7A:
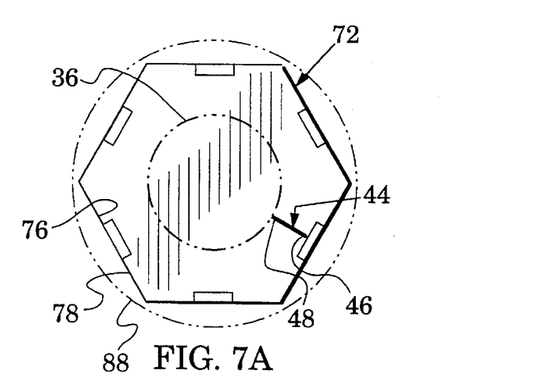
FIG. 7A is a plan view of an electronics support module in the system of FIG. 6.
Figure 7B:
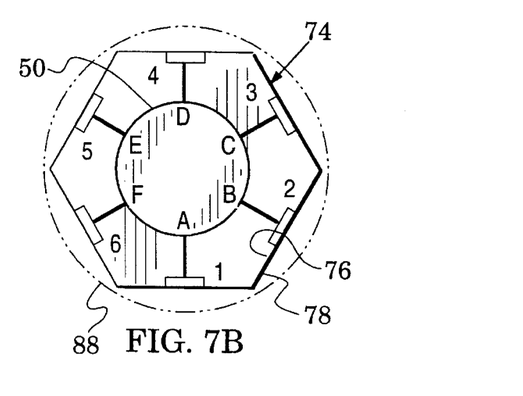
FIG. 7B is a plan view of a switching module in the system of FIG. 6.
Figure 8:
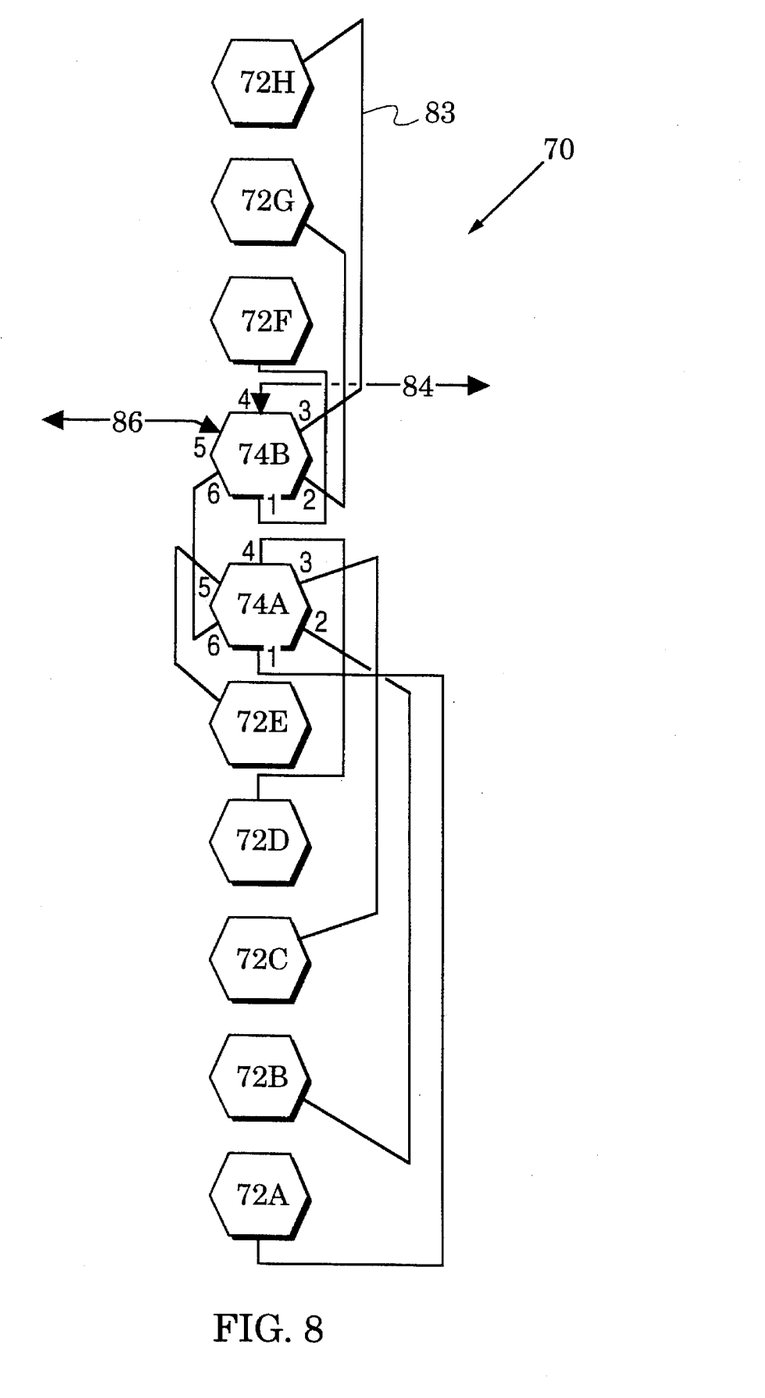
FIG. 8 is a schematic diagram of the system of FIG. 6.

The modules of the system 70 are positioned along the system axis 79 so that the connectors 82 of adjacent modules are aligned. This arrangement also causes the perimeter faces 78 to be axially aligned. The support modules 72A–72E are rotated so that none of their interconnection buses 44 are axially aligned. In a similar manner, the support modules 72F–72H are rotated so that none of their interconnection buses 44 are axially aligned.

In operation of this system, the first switching module 74A can connect any pair of connectors 82 of the support modules 72A–72E. This switching is controlled through the ports 1–5 of the switch 50 of the module 74A. The interconnecting signal paths are formed by the connectors 82 of the switching module 74A and the axially aligned connectors of the modules 72A–72E. A second switching module 74B provides a similar switching function for the support modules 72F–72H by selective switching between its ports 1–3.

Alternatively, any connector of the modules 72A–72E can be connected to any connector of the modules 72F–72H. This is accomplished via a connection between ports F of the switching modules 74A and 74B. This connection is formed through the axially engaged connectors 82 of these two modules. For example, the interconnection buses 44 of support modules 72B and 72H are connected when the ports B and F of the switching module 74A are selectively coupled and the ports C and F of the switching module 74B are selectively coupled.

Connectors numbered 4 and 5 of the switching module 74B are coupled through input/output paths 84 and 86 to external circuits. Any connector of the support modules 72 can be connected to one of these input/output paths. For example, the interconnection bus 44 of module 72A is connected to the input/output path 84 when ports A and F of switching module 74A are coupled together and ports D and F of switching module 74B are coupled together.

In the embodiment 70, axial connector engagement between the switching modules 74A and 74B is required only for connector number 6. In the system 70, the other connectors of the switching modules 74A and 74B are not configured for axial engagement at the interface between these modules. This axial connector selectivity is accommodated by the structure of the connectors 82 which is described hereinafter with reference to FIGS. 11A–11G.

Some of the signal transmission paths of the system 70 include unused portions. For example, switch port F on switching module 74A has access to the interconnection bus 44 of module 72E through connector number 6 of module 74A and a respective connector of module 72E. The remainder of the connectors 82 of modules 72A–72D which are axially aligned with the connector number 6 of the module 74A comprise a path portion that is not needed for interconnection.

Therefore, this signal path portion is unused and unterminated. If the length of this path portion is small compared to the signal wavelength $\lambda$, the existence of this portion may be of no concern. In contrast, if the length of the path portion is comparable to the signal wavelength λ the portion may cause signal reflections at the bus connector 82A of module 72E that degrades the system performance. If this is the case, the unused path portion is preferably isolated. Means for isolation will be described further with reference to the exemplary connectors that are illustrated in FIGS. 11A–11D.

The polygon-shaped perimeter 76 facilitates the formation of a variety of compact interconnection systems. For example, if the system 70 is housed in a cylindrical housing 88 (e.g., a missile or a satellite-carrying rocket) as shown by broken lines in FIGS. 7A and 7B, the space between the polygon faces 78 and the housing 88 can be used for the passage of other system interface structures, e.g., hydraulic lines, guidance controls and sensor communication lines. As a second example, if the connectors 82 are also adapted for axial engagement, then the polygon-shaped perimeter 76 causes the modules 72 and 74 to be especially suited for a planar tiling and vertical stacking arrangement as shown in the system 100 of FIG. 9.

The system 100 includes two planar levels 102 and 104. The upper level 102 includes a pair of switching modules 74A and 74B and electronics support modules 72A–72F. The lower level 104 is similarly configured with two switching modules 74C and 74D and corresponding electronics support modules, of which 72G through 72I and 72L are visible in FIG. 9. The lower level 104 is mounted on a module support member in the form of a circuit board 106. The modules of the system 100 thereby facilitate a variety of axially and radially engaged interconnections that allow any module to be selectively connected with any other or with input/output paths 110, 112.

Figure 9:
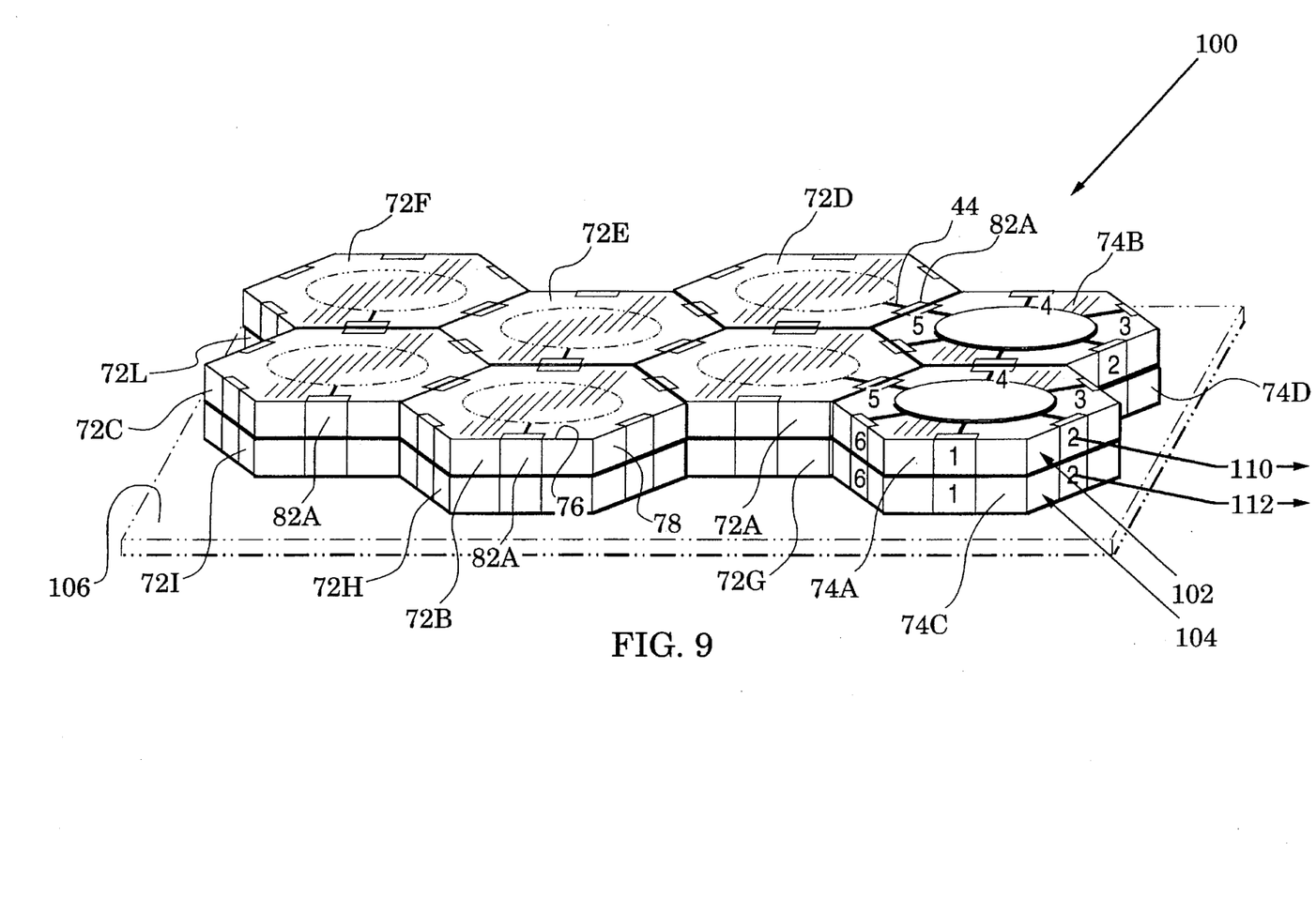
FIG. 9 is a perspective view of another electronics support and signal interconnection system.

In an exemplary division of modules into groups, support modules 72A–72C are interconnected with the switching module 74A, support modules 72D–72F are interconnected with the switching module 74B, support modules 72G–72I are interconnected with the switching module 74C and the remaining support modules are interconnected with the switching module 74D. Interconnection between any selected pair of support modules or between any module and the input/output paths 110, 112 is accomplished by axial and radial connection of the switching modules 74A–74D.

Communication between each module group is radially and axially. For example, switching module 74A communicates with the support module 72A through their radially engaged connectors. Module 74A and modules 72B and 72C communicate axially to the interconnection board 106 and their signal paths are then completed through the signal paths of the circuit board 106.

Communication between module groups is provided by axial and radial connections between the switching modules 74A–74D. Signal interconnection is provided through adjoining connectors for the switching modules 74A–74D. For example, interconnection between modules 74A and 74B is through their radially adjoining connectors and interconnection between modules 74A and 74C is through their axially adjoining connectors.

In operation, therefore, signal interconnections between the modules of the system 100 are obtained both axially and radially through the faces 78 of their hexagonal perimeters 76. The hexagonal shape enables a compact axial and planar module arrangement.

Figure 10:
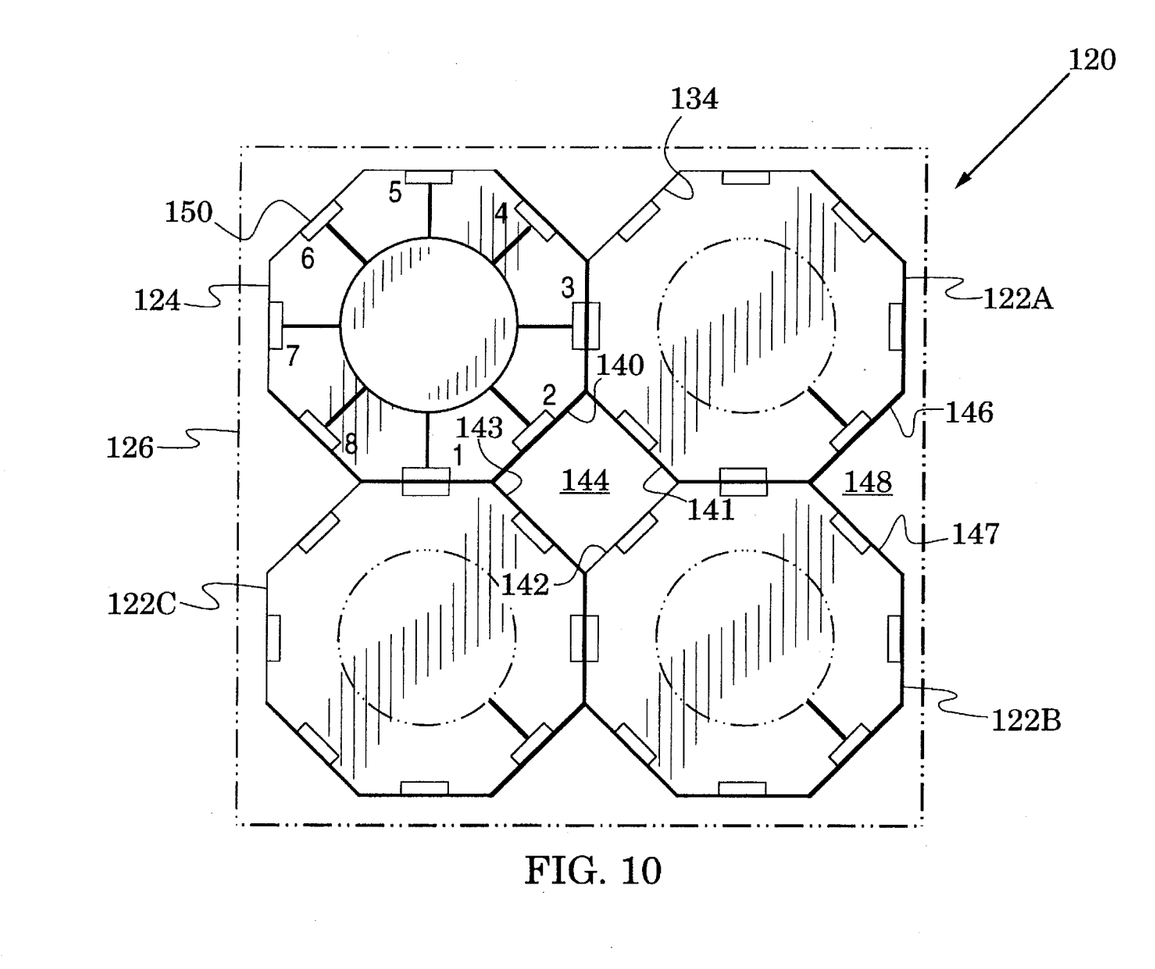
FIG. 10 is a plan view of another electronics support and signal interconnection system.

Other polygon shapes can be advantageously employed. For example, FIG. 9 illustrates a system 120 that includes electronics support modules 122A–122C and a switching module 124. which are carried on a circuit board 126. These modules have a perimeter 134 that has eight faces which define a regular octagon. When these modules are arranged in a coplanar and adjoining relationship, they define several intermodule passages which can be useful pathways for other circuit-related systems, e.g., heat-removal devices. For example, the faces 140, 141, 142 and 143 form a passage 144. If the system 120 were housed in a square housing that abutted the circuit board 126, the faces 146 and 147 would form sides of another passage 148.

Each module of the system 120 includes eight interconnection connectors 150. These connectors are preferably positioned to adjoin the module perimeters 134 to facilitate radial and axial engagement of the connectors. In the system 120, the connectors are rotationally centered on their respective perimeter faces. Although other arrangements with faces can be used, this arrangement permits a module to be inverted and still engage its connectors radially and axially with those of other modules.

FIGS. 11A–11E are views of the structure within the curved line 11 of FIG. 6. These figures illustrate exemplary connectors that are suitable for the axial and radial engagement that has been shown above in the system embodiments 20, 70, 100 and 120 of FIGS. 1, 6, 9 and 10.

Figure 11A:
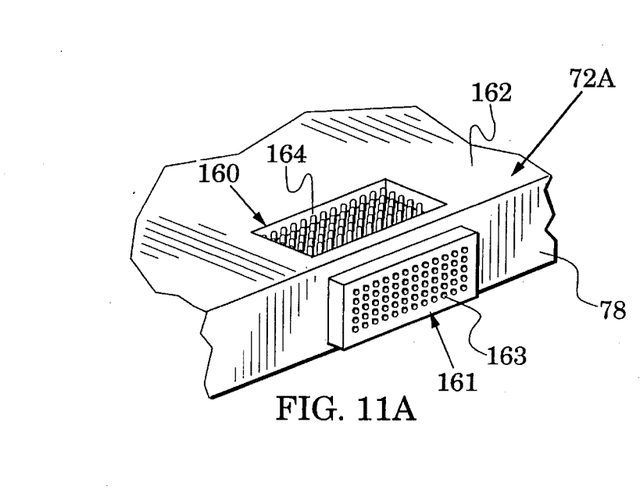
FIGS. 11A–11E are fragmentary perspective views of the area within the curved line 11 of FIG. 6 which illustrate exemplary connector structures.

FIG. 11A illustrates pin-and-socket type connectors 160, 161. The pin connector 160 is positioned on an upper face 162 of the module 72A for axial engagement of a socket connector that would be positioned in the lower face of an axially adjacent module, e.g., module 72B in FIG. 6. The socket connector 161 is positioned in the hexagonal face 78 for radial engagement with a pin connector that would be positioned in a respective face of a radially adjacent module, e.g., module 74A in FIG. 9. In this type of connector, sockets 163 slidingly receive pins 164.

Figure 11B:
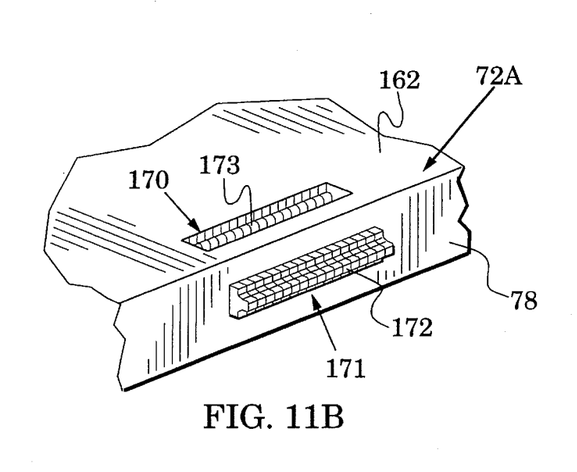

FIG. 11B illustrates tongue-and-groove type connectors 170–171 which are positioned respectively on the upper face 162 and hexagonal face 78 of the module 72A. In this type of connector, tongue-shaped contacts 172 are slidingly received into groove-shaped contacts 173.

Figure 11C:
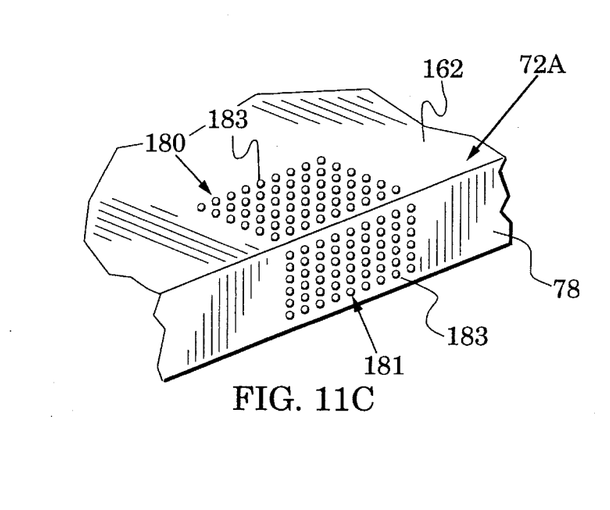

Ball-array type connectors 180–181 are shown in FIG. 11C. They are positioned respectively on the upper face 162 and hexagonal face 78 of the module 72A. In these connectors, ball contacts 183 of one connector abuttingly mate with respective balls 183 of another connector. They are typically joined by reflow solder techniques.

Figure 11D:
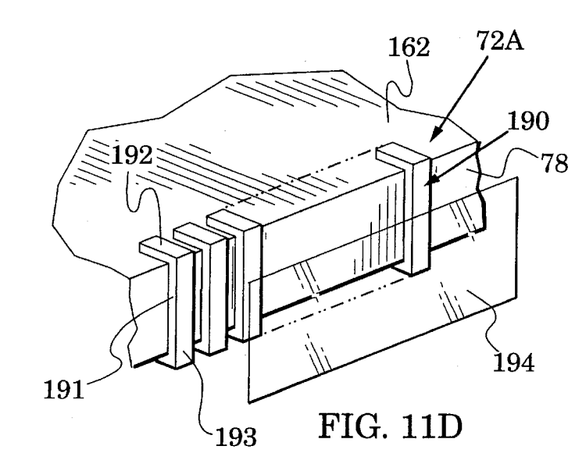

FIG. 11D illustrates ribbon-contact type connectors 190. In this type of connector, spaced ribbon contacts 191 wrap around the upper face 162, the hexagonal face 78 and the lower face of the module 72A. A ribbon portion 192 along the upper face 162 is arranged for axial contact with a corresponding portion of another connector. A ribbon portion 193 along the hexagonal face 78 is arranged for radial contact with a corresponding portion of another connector. These connectors are also typically joined by reflow solder techniques.

In some embodiments of the invention, e.g., system 70 of FIG. 6, it may be desirable to block electrical contact between adjacent connectors. This may be required by the particular system interconnect scheme or it may be for the purpose of isolating unused signal paths (e.g., the connectors of modules 72A–72D that are radially aligned with connector number 6 of the switching module 74A). FIG. 11D illustrates an insulating sheet 194 that can be positioned between contact portions, e.g., the portions 193, of adjacent connectors achieve this blocking. The sheet 194 can be formed of various insulating materials, e.g., mica.

Figure 11E:
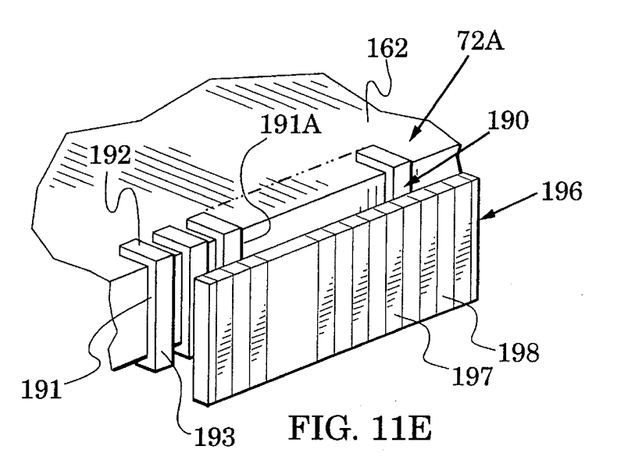

A selective blocking member 196 is illustrated in FIG. 11E. This member is formed of conductive ribs 197 and nonconductive ribs 198 of a suitable material, e.g., an elastomer. The conductive ribs 197 can be selectively placed to provide or block electrical contact for selected ribbons 191. For example, in FIG. 11E the portion 193 of the ribbon contact 191A is blocked from electrical contact because a corresponding conductive rib 197 is missing in the member 196.

Figure 12:
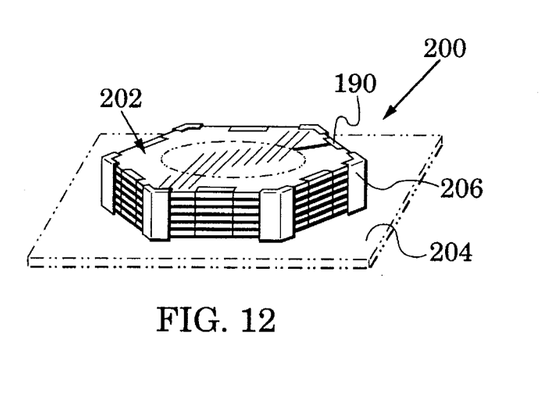
FIG. 12 is a perspective view of an assembled electronics support and signal interconnection system.

In many circuit applications, e.g., microprocessor systems, several integrated circuits are often interconnected on a carrier substrate. Such a substrate and its associated integrated circuits can be realized in accordance with the teachings of the present invention to form a multi-chip module (MCM) 202 as illustrated in FIG. 12. This figure shows several MCM's 202 which are axially combined in a system 200. The MCM's 202 are interconnected with the electrical connectors 190 of FIGS. 11D and 11E. Although these connectors are adequate to physically bind the MCM's 202 and a supporting substrate 204 together, they are augmented by clamps 206 which also are configured to conduct heat down to the substrate 204.

Although embodiments of the invention are particularly suited to carry and interconnect microprocessors and associated circuits, other embodiments can be adapted to support and interconnect virtually any digital or analog system, e.g., D/A and A/D converters, analog receivers, and analog transmitters. The modules can be structurally formed to carry these systems on well known support members, e.g., printed circuit boards, laminated substrates, thermally conductive plastics and enclosure boxes. Although a crossbar switch is particularly suited for use on the switching modules of the invention, other embodiments can be formed with any switch configuration that can interconnect any selected pair of the module's connectors. This switch selection can be made with switching signals that are embedded with incoming data signals on an input/output signal path, e.g., the path 30 in FIG. 1, or, alternatively, the switch control signals can be coupled to each system through dedicated control paths.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

I claim:

1. An interconnection system for multiple electronic circuits, comprising:

a plurality of modules, each configured about a module axis with at least one of said modules adapted to carry an electronic circuit;

one or more connectors carried on each of said modules, each of said connectors positioned at a different one of a set of n connector locations wherein said set has the same spatial relationship on each of said modules and is spatially invariant as its respective module is rotated in steps of 360/n degrees about its axis;

each of said connectors configured to engage any other of said connectors when they are axially aligned and in an adjoining relationship; and one of said modules comprising a switching module that carries a switch configured to selectively connect combinations of the switching module's connectors;

wherein said modules are arranged in a coaxial relationship and adjacent modules are axially and rotationally positioned to engage their respective connectors.

2. The system of claim 1, wherein each of said modules, other than said switching module, includes a signal-interconnection bus having first and second ends with one of said module's connectors comprising a bus connector that is coupled to said bus first end and said bus second end is positioned for connection to an electronic circuit that may be carried by the module.

3. The system of claim 2, wherein said modules are rotationally positioned so that no two of said bus connectors are axially aligned.

4. The system of claim 1, wherein said switch is a crossbar switch.

5. An interconnection system for multiple electronic circuits, comprising:

a plurality of modules, each configured along a module plane that is substantially orthogonal to a module axis with at least one of said modules adapted to carry an electronic circuit;

each of said modules terminating in a perimeter having n faces that define a substantially regular polygon when the module is viewed axially;

one or more connectors carried on each of said modules with each of said connectors positioned adjacent a different one of said faces;

each of said connectors configured to engage a connector in another module when the module's are coplanar and in an adjoining relationship; and one of said modules comprising a switching module that carries a switch configured to selectively connect combinations of the switching module's connectors;

wherein said modules are arranged in a coplanar relationship with a mutual engagement between connectors of adjacent modules.

6. The system of claim 5, wherein each of said modules, other than said switching module, includes a signal-interconnection bus having first and second ends with one of said module's connectors comprising a bus connector that is coupled to said bus first end and said bus second end is positioned for connection to an electronic circuit that may be carried by the module.

7. The system of claim 5, further including a module support member positioned adjacent at least two of said modules, said support member having signal interconnection paths that are configured to connect one or more of said connectors.

8. The system of claim 5, wherein said switch is a crossbar switch.

9. The system of claim 5, wherein n=6.

10. The system of claim 5, wherein n=8.

11. The system of claim 5, wherein each of said connectors is centered on its respective face.

12. An interconnection system for multiple electronic circuits, comprising:

a plurality of modules, each configured along a module plane that is substantially orthogonal to a module axis and at least one of said modules adapted to carry an electronic circuit;

each of said modules terminating in a perimeter having n faces that define a substantially regular polygon when the module is viewed axially;

one or more connectors carried on each of said modules, each of said connectors positioned at a different one of a set of n connector locations wherein said set has the same spatial relationship on each of said modules and is spatially invariant as its respective module is rotated in steps of 360/n degrees about its axis;

each of said connectors positioned adjacent a different one of said faces and configured to engage any other of said connectors when they are in either a coaxial and adjoining relationship or a coplanar and adjoining relationship; and one of said modules comprising a switching module that carries a switch configured to selectively connect combinations of the switching module's connectors:

wherein each of said modules is arranged to have at least one of a coaxial and a coplanar adjacent relationship with another of said modules, with a mutual engagement between connectors of adjacent modules.

13. The system of claim 12, wherein each of said modules, other than said switching module, includes a signal-interconnection bus having first and second ends with one of said module's connectors comprising a bus connector that is coupled to said bus first end and said bus second end is positioned for connection to an electronic circuit that may be carried by the module.

14. The system of claim 12, further including a module support member positioned adjacent at least two of said modules, said support member having signal interconnection paths that are configured to connect one or more of said connectors.

15. The system of claim 12, wherein said switch is a crossbar switch.

16. The system of claim 12, wherein n=6.

17. The system of claim 12, wherein n=8.

18. The system of claim 12, wherein each of said connectors is rotationally centered on its respective face.

* * * * *